United States Patent
Akahori et al.

(12) 
(10) Patent No.: US 6,737,350 B1
(45) Date of Patent: May 18, 2004

(54) METHOD OF MANUFACTURING SEMICONDUCTOR DEVICE

(75) Inventors: Takashi Akahori, Hachioji (JP); Kouichiro Inazawa, Tokyo-To (JP); Kouji Senoo, Kofu (JP); Masaaki Hagiwara, Inagi (JP)

(73) Assignee: Tokyo Electron Limited, Tokyo-To (JP)

( * ) Notice: Subject to any disclaimer, the term of this patent is extended or adjusted under 35 U.S.C. 154(b) by 438 days.

(21) Appl. No.: 09/665,960

(22) Filed: Sep. 21, 2000

Related U.S. Application Data

(63) Continuation of application No. PCT/JP99/04741, filed on Sep. 1, 1999.

(30) Foreign Application Priority Data

Sep. 2, 1998 (JP) ............................................. 10-264040
Oct. 27, 1998 (JP) ............................................. 10-321537

(51) Int. Cl.⁷ ......................................... H01L 21/4763
(52) U.S. Cl. ........................ 438/634; 438/725; 438/622
(58) Field of Search ................................. 438/384, 638, 438/622, 624, 639, 640, 725, 634

(56) References Cited

U.S. PATENT DOCUMENTS

| | | | | |
|---|---|---|---|---|
| 5,920,790 A | * | 7/1999 | Wetzel et al. | 438/618 |
| 6,103,591 A | * | 8/2000 | Kagamihara | 438/421 |
| 6,159,840 A | * | 12/2000 | Wang | 438/618 |
| 6,268,283 B1 | * | 7/2001 | Huang | 438/638 |

FOREIGN PATENT DOCUMENTS

| | | | | |
|---|---|---|---|---|
| JP | 3-198327 | | 8/1991 | |
| JP | 6-53161 | | 2/1994 | |
| JP | 9-55429 | | 2/1997 | |
| JP | 9-246264 | | 9/1997 | |
| JP | 10-261707 | | 9/1998 | |
| JP | 11-176935 | | 7/1999 | |
| JP | 11-297820 | | 10/1999 | |
| JP | 2000208622 | * | 7/2000 | ......... H01L/21/768 |

* cited by examiner

*Primary Examiner*—Caridad Everhart
(74) *Attorney, Agent, or Firm*—Finnegan, Henderson, Farabow, Garrett & Dunner LLP

(57) ABSTRACT

A semiconductor device using, e.g., a fluorine containing carbon film, as an interlayer dielectric film is produced by a dual damascene method which is a simple technique.

After an dielectric film, e.g., an $SiO_2$ film 3, is deposited on a substrate 2, the $SiO_2$ film 3 is etched to form a via hole 31 therein, and then, a top dielectric film, e.g., a CF film 4, is deposited on the top face of the $SiO_2$ film 3. If the CF film is deposited by activating a thin-film deposition material having a bad embedded material, e.g., $C_6F_6$ gas, as a plasma, the CF film 4 can be deposited on the top face of the SiO2 film 3 while inhibiting the CF film from being embedded into the via hole 31. Subsequently, by etching the CF film 4 to form a groove 41 therein, it is possible to easily produce a dual damascene shape wherein the groove 41 is integrated with the via hole 31.

9 Claims, 18 Drawing Sheets

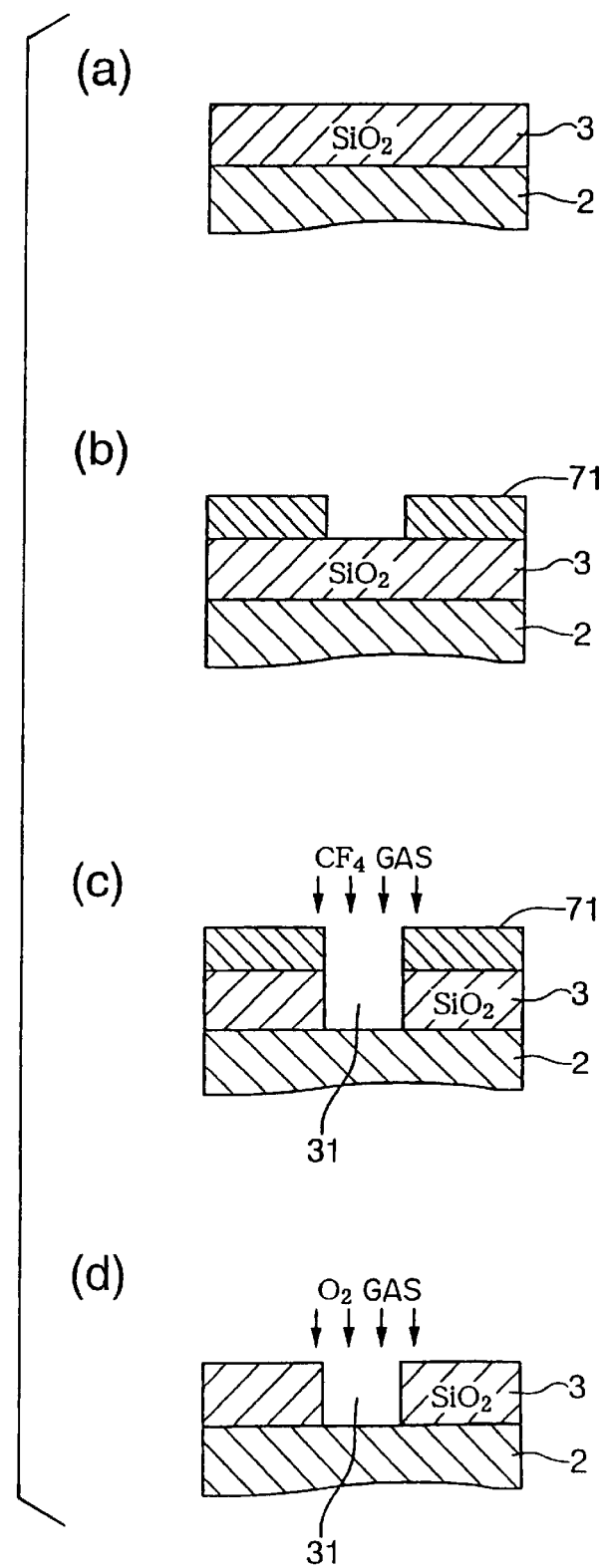
F I G. 2

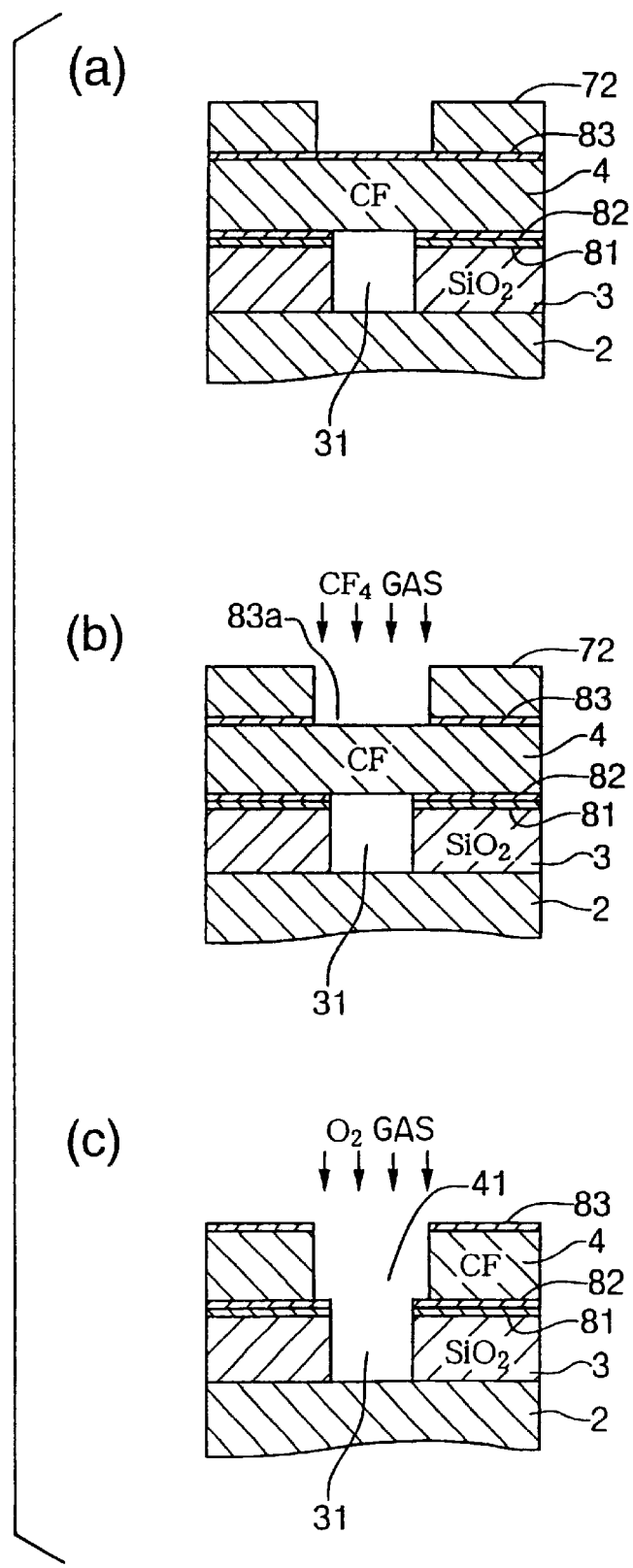
F I G. 4

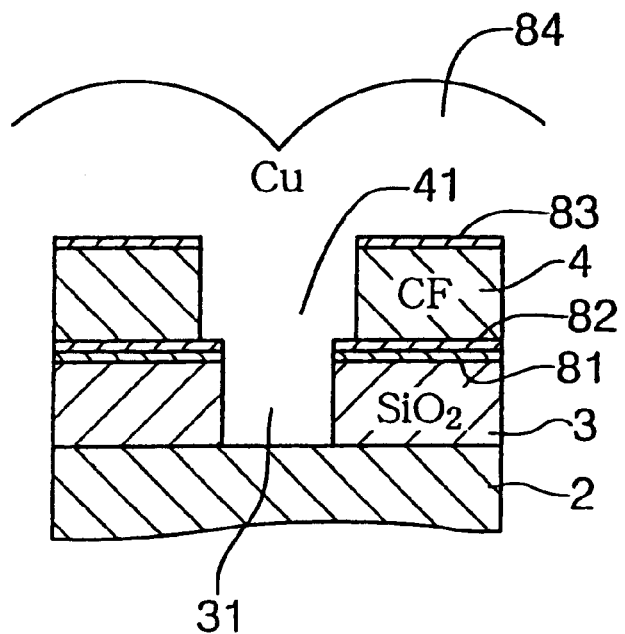
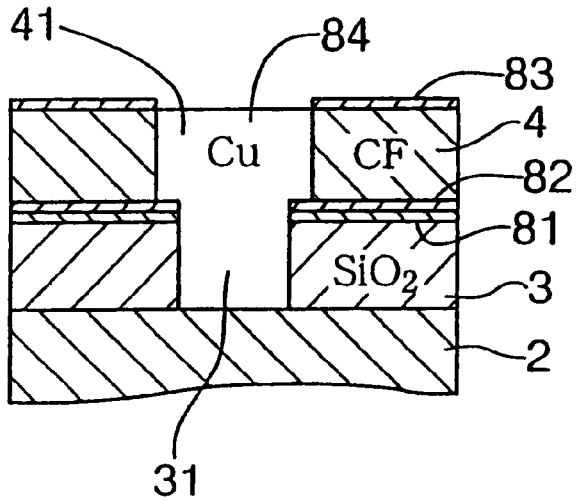
F I G. 5

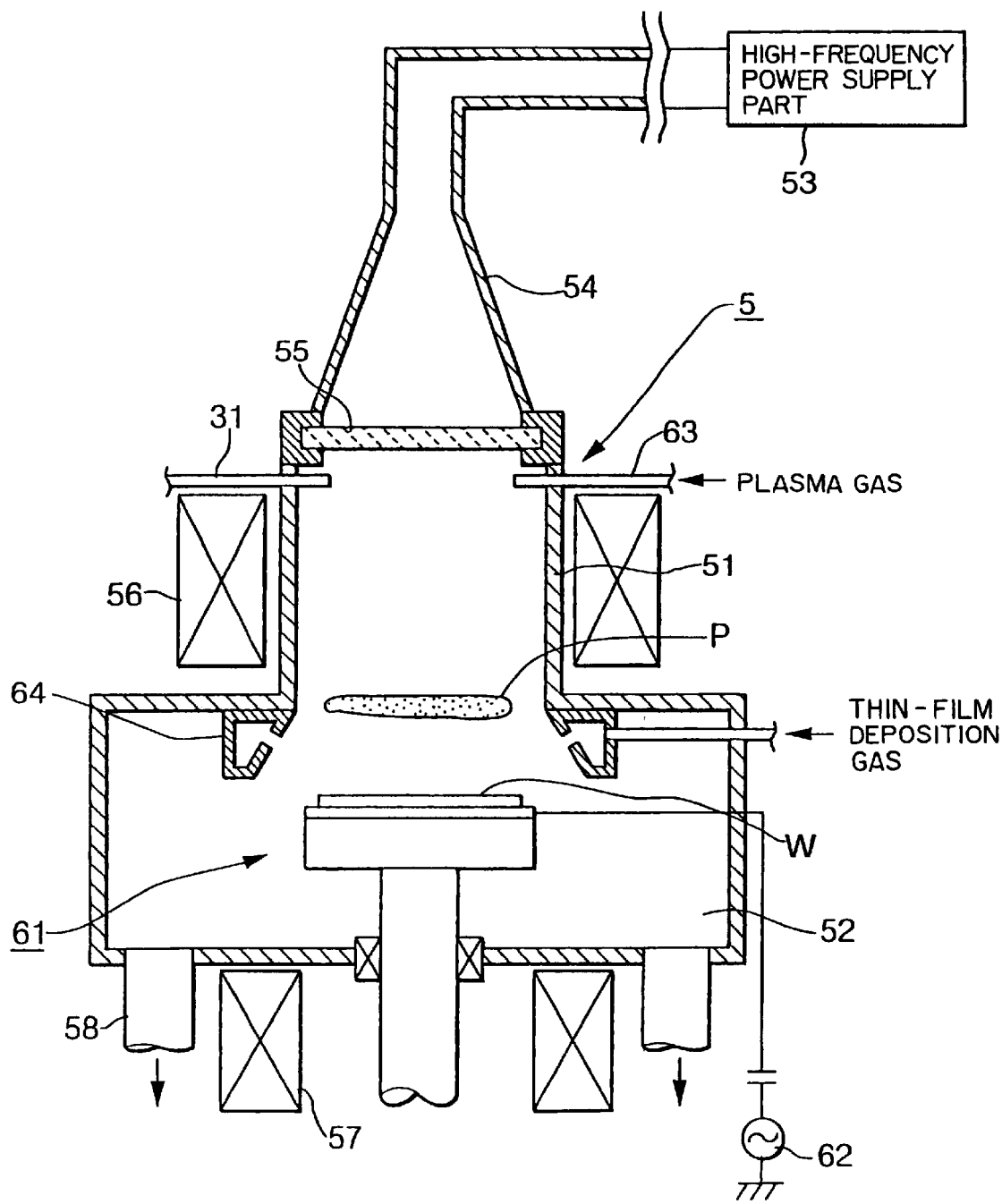
F I G. 6

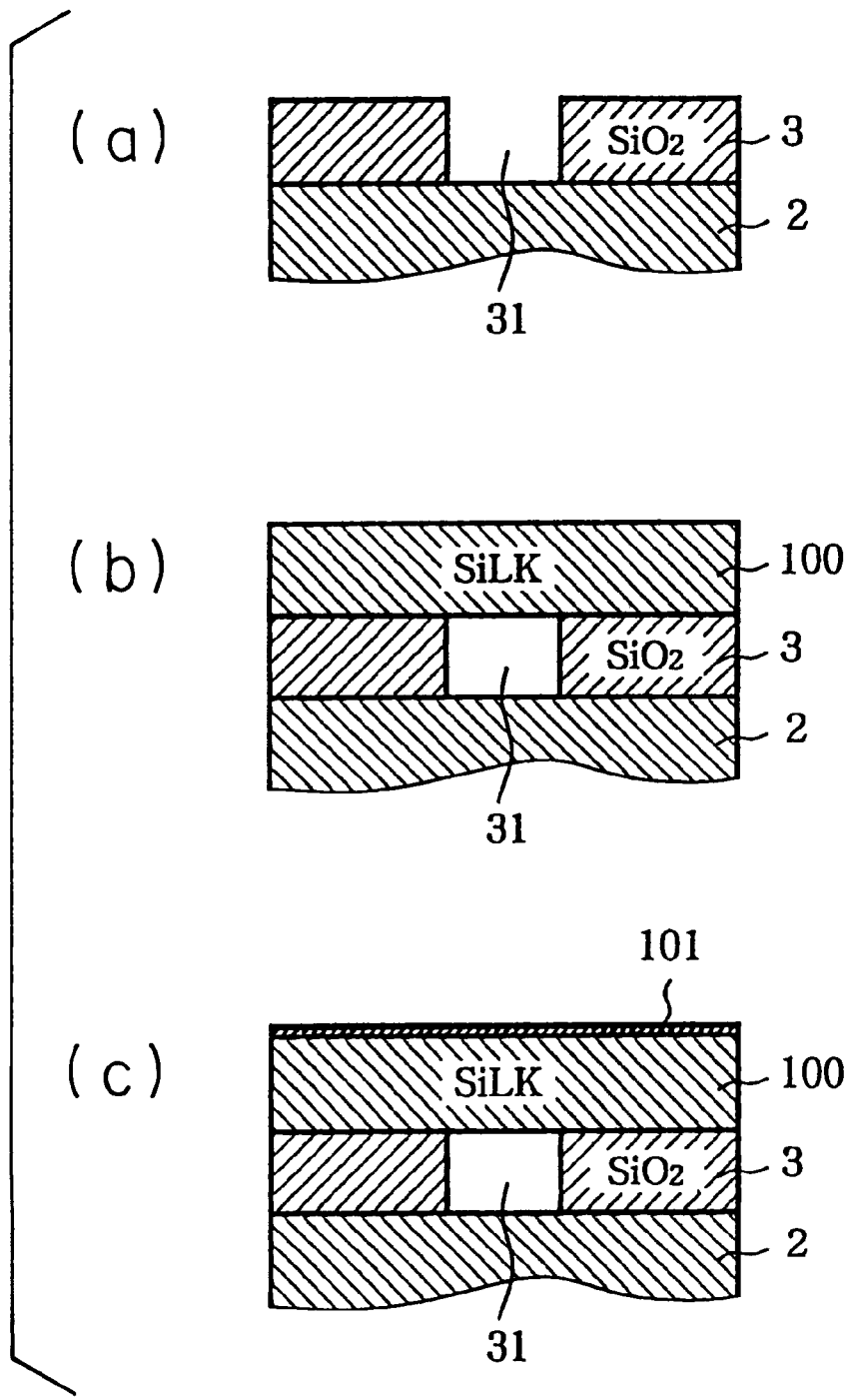
F I G. 9

| COATING FILM | HARD MASK | ETCHING GAS | INSULATING FILM |
|---|---|---|---|
| SiLK | SiO2, SiOF SiN, TiN HSQ, MSQ ORGANIC SOG POROUS SILICA | O2 GAS or H2 GAS | SiO2, SiOF SiN, HSQ MSQ, ORGANIC SOG POROUS SILICA |
| BCB | | | |
| FLARE | | | SiO2, SiOF HSQ, MSQ |
| HSQ | PHOTORESIST | CF CONTAINING GAS | SiLK BCB FLARE CF SiO2 SiN |
| MSQ | | | |
| ORGANIC SOG | PHOTO-RESIST / SiO2 | | |
| POROUS SILICA | | | |

FIG. 12

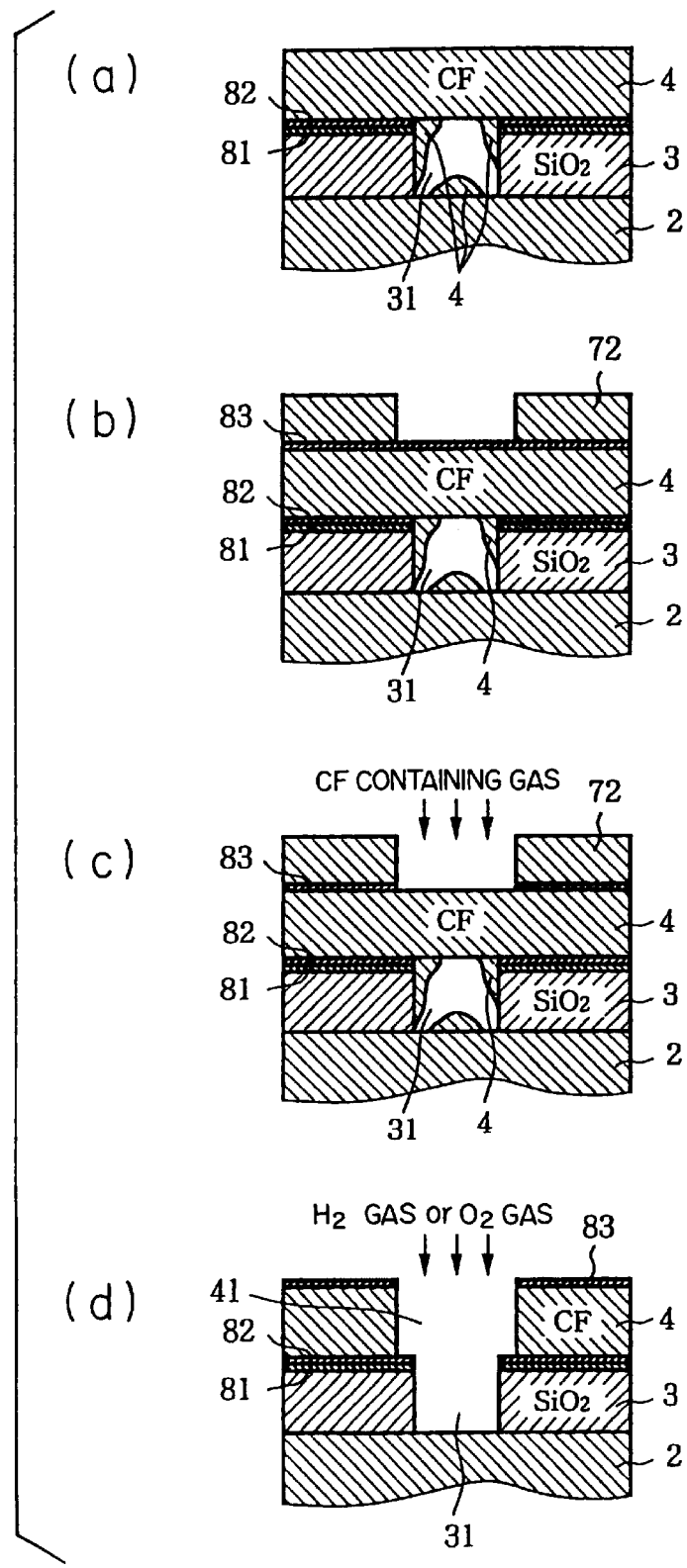
F I G. 13

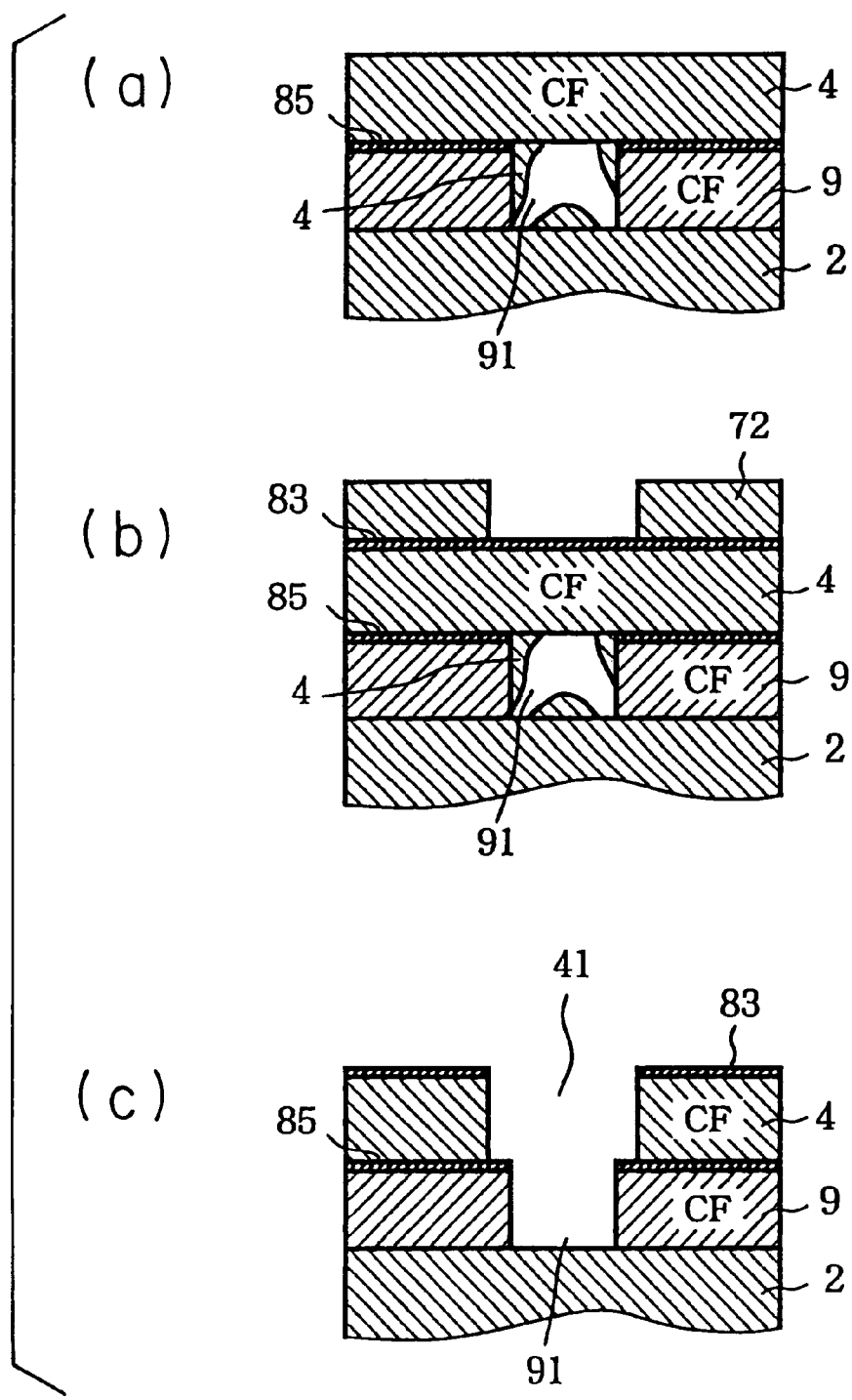
F I G. 15

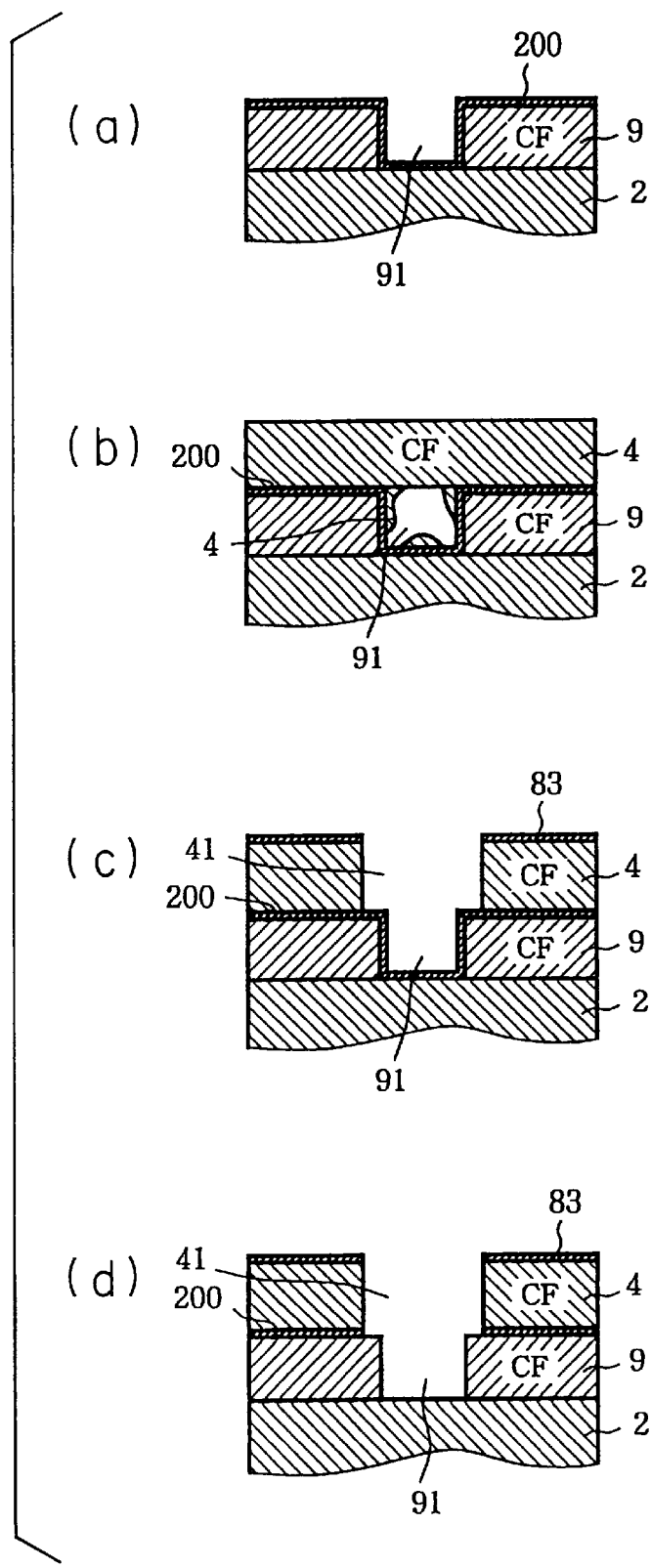
F I G. 16

| | |
|---|---|
| ORGANIC SOG | $-\left(\begin{array}{c}CH_3\\|\\Si-O\\|\\O\\|\end{array}\right)_m -\left(\begin{array}{c}|\\Si-O\\|\\O\\|\end{array}\right)_n$ |
| POLYIMIDE | $-\left(R_1-N\diamondsuit{CO \atop CO}R_2{CO \atop CO}\diamondsuit N\right)_n$ |
| F CONTAINING POLYIMIDE | $-\left(R_1-\underset{CF_3}{\overset{CF_3}{\underset{|}{\overset{|}{C}}}}-R_1-N\diamondsuit{CO \atop CO}R_2-\underset{CF_3}{\overset{CF_3}{\underset{|}{\overset{|}{C}}}}-R_2{CO \atop CO}\diamondsuit N\right)_n$ |
| BCB | $-\left(\begin{array}{c}CH\\|\\CH_2\end{array}\bigcirc-CH=CH-\underset{CH_3}{\overset{CH_3}{\underset{|}{\overset{|}{Si}}}}-O-\underset{CH_3}{\overset{CH_3}{\underset{|}{\overset{|}{Si}}}}-\bigcirc\bigcirc\begin{array}{c}CH\\|\\CH_2\end{array}\right)_n$ |
| POLYALLYL ETHER FLUORIDE | $-\left(R-O-\underset{F\ F}{\overset{F\ F}{\bigcirc}}\underset{F\ F}{\overset{F\ F}{\bigcirc}}-O\right)_n$ |
| F CONTAINING PALERIN | $-(CF_2-\bigcirc-CF_2)_n$ |
| TEFLON | $-(CF_2-CF_2)_m\quad\left(\begin{array}{c}CF-CF\\O-C-O\\CF_3\ CF_3\end{array}\right)_n$ |
| CYTOP | $-\left(CF_2-CF\diagup{(CF_2)_x \atop (CF_2)_y}\diagdown CF-(CF_2)_x\right)_n$ |

FIG. 19

METHOD OF MANUFACTURING SEMICONDUCTOR DEVICE

This application is a Continuation of International Application No. PCT/JP99/04741, filed Sep. 1, 1999, which is incorporated herein by reference.

TECHNICAL FIELD

The present invention relates generally to a method of manufacturing semiconductor device by a dual damascene method.

BACKGROUND ART

In order to achieve the high density integration of semiconductor devices, it has been developed to provide devices, such as the scale down of patterns and the multilayering of circuits. As one of such devices, there is a technique for multilayering wiring. In order to provide a multi-layer metallization structure, a number n wiring layer and a number (n+1) wiring layer are connected to each other by means of a conductive layer, and a thin film called an interlayer dielectric film is formed in a region other than the conductive layer. This interlayer dielectric film is sometimes formed in a layer right above or further above a silicon substrate.

As one of typical interlayer dielectric films, there is a $SiO_2$ film. In recent years, in order to more accelerate operation of devices, it has been required to reduce the dielectric constant of the interlayer dielectric film, and the material of the interlayer dielectric film has been examined. That is, the dielectric constant of $SiO_2$ is about 4, and it has been diligently studied to dig up materials having a lower dielectric constant than that of $SiO_2$. As one of such materials, it has been studied to put SiOF having a dielectric constant of 3.5 into practice. The inventor has taken notice of a fluorine containing carbon film (which will be hereinafter referred to as a "CF film") having a still lower dielectric constant.

By the way, as a technique for simultaneously forming a groove wiring and a via plug, there is a dual damascene process. As methods of manufacturing semiconductor device using a low dielectric constant interlayer dielectric film by this process, supposed process flows, such as a method for etching a groove, a method for previously etching a via hole and a method for simultaneously etching a groove and a via hole by self alignment, are described in Monthly Semiconductor World, February 1998, pp. 108–114.

Referring to FIGS. 17 and 18, the method for simultaneously etching by the self alignment will be briefly described. In FIG. 17(a), reference number 10 denotes a first low dielectric constant interlayer dielectric film, 11 denotes an $Si_3N_4$ layer, and 12 denotes an etching stopper layer of an $Si_3N_4$ layer of an $SiO_2$ film. First, as shown in FIGS. 17(b) and 17(c), the etching stopper layer 12 is etched so as to have a hole pattern. In the figure, reference number 13 denotes a photoresist. Then, on the top face of the etching stopper layer 12, a second low dielectric constant interlayer dielectric film 14, in which a groove will be formed, and a hard mask 15 of an $SiO_2$ film are deposited in that order (see FIGS. 17(d) and 17(e)).

Subsequently, as shown in FIGS. 18(a) and 18(b), the hard mask 15 is etched so as to have a groove pattern, and then, as shown in FIG. 18(c), the hard mask 15 is used as a mask for carrying out etching to form a groove 14a in the second low dielectric constant interlayer dielectric film 14. Then, the etching stopper layer 12 is used as a mask for further continuing the etching to form a via hole 10a in the first low dielectric constant interlayer dielectric film (see FIG. 18(d)). In the figure, reference number 16 denotes a photoresist.

However, the above described method requires, in total, four etching processes for the etching stopper layer 12, the hard mask 15 and the first and second low dielectric constant interlayer dielectric films 10 and 14, so that the number of processes is large. In addition, since the etching for the groove and the etching for the via hole are sequentially carried out, there is supposed a problem, such as the influence of excessive radicals due to the sudden decrease of the etched area from the groove to the via hole.

Also in the process flow for forming a via hole after forming a groove and in the process flow for forming a groove after forming a via hole, the number of etching processes is large, and it is required to carry out a process, which is not carried out in conventional etching processes, for treating a place which has been etched once, so that various problems are estimated. Thus, there are serious problems in that the dual damascene process is complicated in the present circumstances and has a bad throughput to increase costs.

DISCLOSURE OF THE INVENTION

The present invention has been made in such circumstances, and it is therefore a principal object of the present invention to provide a method of manufacturing semiconductor device using, e.g., a fluorine containing carbon film having a dielectric constant, as an interlayer dielectric film by a dual damascene method which is a simple technique.

Therefore, the present invention is characterized by the steps of: forming an dielectric film on an object to be treated; etching the dielectric film to form a via hole therein; forming a top dielectric film of, e.g., a fluorine containing carbon film, on a surface of the dielectric film, in which the via hole has been formed, using a thin-film deposition material having a bad embedded characteristic; and etching the top dielectric film to form therein a groove, in which a metal is embedded for forming a wiring, so that the groove contacts at least a part of the via hole. The expression "a bad embedded characteristic" means that the embedding of an dielectric film into a hole of an underlayer is bad since an object is the hole, although the embedding of an dielectric film into a groove is usually discussed. For example, the step of forming the fluorine containing carbon film is carried out by activating a thin-film deposition material, which includes a compound of carbon and fluorine and which has a bad embedded characteristic, e.g., hexafluorobenzene, as a plasma.

In addition, the present invention is characterized by the steps of: forming an dielectric film on an object to be treated; etching the dielectric film to form a via hole therein; forming a top dielectric film having an etch selectivity, which is different from that of the dielectric film, on a surface of the dielectric film, in which the via hole has been formed; etching the top dielectric film to form therein a groove, in which a metal is embedded for forming a wiring, so that the groove contacts at least a part of the via hole; and etching the top dielectric film for a predetermined period of time after the etching of the top dielectric film is completed, so that the top dielectric film deposited in the via hole is etched to be removed. In this case, a thin film having an etch selectivity which is different from that of the dielectric film may be formed on the surface of the dielectric film, in which the via hole is formed, to form the top dielectric film on the thin film. The top dielectric film may be a fluorine containing carbon film or a coating film.

BRIEF DESCRIPTION OF THE DRAWINGS

FIG. 2 is a process drawing showing a concrete example of a method according to the present invention;

FIG. 4 is a process drawing showing a concrete example of a method according to the present invention;

FIG. 5 is a process drawing showing a concrete example of a method according to the present invention;

FIG. 6 is a longitudinal sectional view showing an example of a plasma treatment system for carrying out a method according to the present invention;

FIG. 9 is a process drawing showing another example of a method according to the present invention;

FIG. 12 is a characteristic diagram showing the relationship between coating films, hard masks, etching gases and dielectric films;

FIG. 13 is a process drawing showing another example of a method according to the present invention;

FIG. 15 is a process drawing showing a further example of a method according to the present invention;

FIG. 16 is a process drawing showing a still further example of a method according to the present invention;

FIG. 19 is a table showing examples of substances forming dielectric films and their chemical structural formula.

BEST MODE FOR CARRYING OUT THE INVENTION

Figure 1:
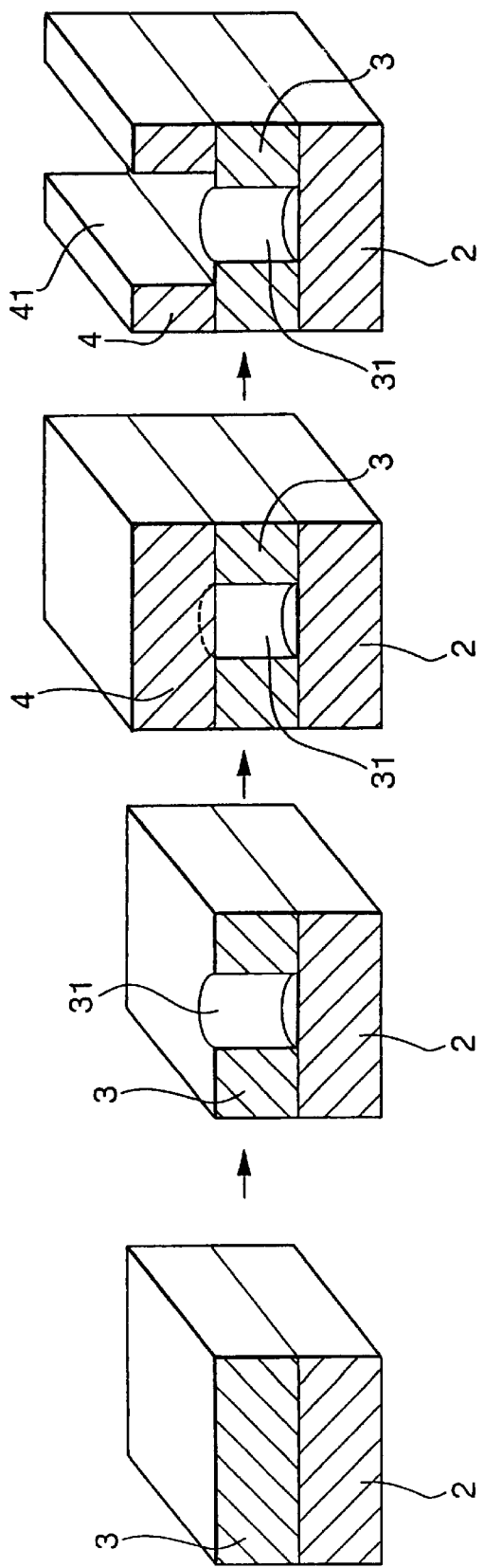
FIG. 1 is a process drawing for explaining an outline of a method according to the present invention.
Figure 3:
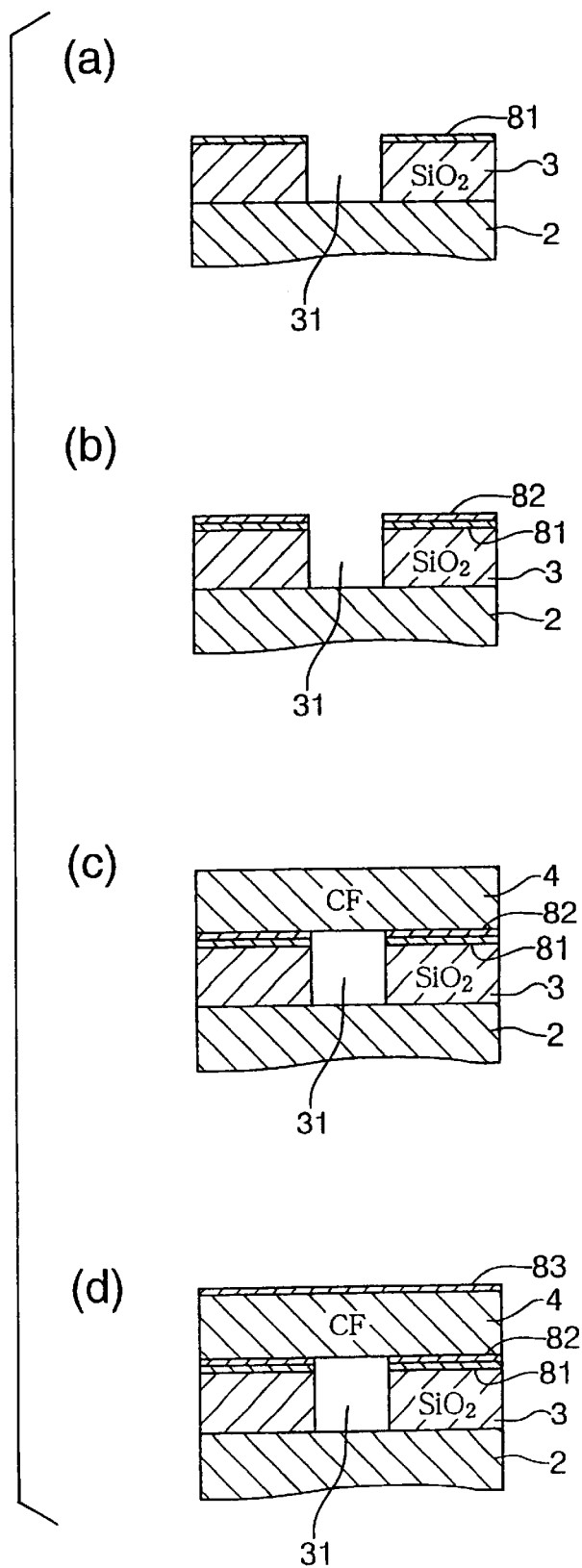
FIG. 3 is a process drawing showing a concrete example of a method according to the present invention.

First, referring to FIG. 1, an outline of a method according to the present invention will be described. In the method according to the present invention, an dielectric film, e.g., an $SiO_2$ film 3, is deposited on a substrate 2 serving as an object to be treated, and the $SiO_2$ film 3 is etched to form a via hole 31. Thereafter, a top dielectric film of a thin-film deposition material having a bad embedded characteristic, e.g., a CF film 4, is deposited on the top face of the $SiO_2$ film 3. Then, the CF film 4 is etched to form a groove 41 to produce a dual damascene shape which is integrally formed by the groove 41 and the via hole 31. Furthermore, the dielectric film on the substrate 2 may be an dielectric film formed on a so-called Si substrate which is arranged in the lowest layer of a semiconductor device having a multi-layer metallization structure, or an interlayer dielectric film formed in a number n wiring layer and a number (n+1) wiring layer which are upper layers.

In this method, since the CF film 4 is deposited on the top face of the $SiO_2$ film 3 while inhibiting the CF film from being embedded into the via hole 3 by using the thin-film deposition material having the bad embedded characteristic, it is possible to easily form the dual damascene shape if the groove 41 is subsequently etched. The groove 41 is filled with copper (Cu) or aluminum (Al) for forming a wiring layer of Cu or Al, and the via hole 31 is filled with a metal for connecting upper and lower wiring layers to each other.

Referring to FIGS. 2 through 5, an example of a method of manufacturing semiconductor device wherein an $SiO_2$ film and a CF layer are stacked and a via hole and a groove are formed in the $SiO_2$ film and the CF film, respectively, according to the present invention, will be described below. First, as shown in FIG. 2(a), an $SiO_2$ film 3 having a thickness of, e.g., about 7000 angstroms, is formed on the surface of a substrate 2. This $SiO_2$ film 3 is formed by activating a thin-film deposition gas as a plasma in a plasma treatment system utilizing, e.g., the ECR (Electron Cyclotron Resonance).

Referring to FIG. 6, the plasma treatment system will be briefly described. In this system, a high-frequency wave (a microwave) of, e.g., 2.45 GHz, is supplied from a high-frequency power supply part 53 into a vacuum vessel 5, which comprises a first vacuum chamber 51 and a second vacuum chamber 52, via a waveguide 54 and a transmission window 55, and a magnetic field having an intensity of 875 gausses in the vicinity of an ECR point P is formed so as to extend from the first vacuum chamber 51 to the second vacuum chamber 52 by a main electromagnetic coil 56 and an auxiliary electromagnetic coil 57 which are provided around the first vacuum chamber 51 and on the bottom side of the second vacuum chamber 52, respectively. Thus, the interaction between the magnetic field and the microwave causes an electron cyclotron resonance at the ECR point P.

When the $SiO_2$ film is formed by this system, a semiconductor wafer W serving as a substrate 2 is mounted on a mounting table 61 which is provided in the second vacuum chamber 52 and which has a top face formed as an electrostatic chuck, and a bias voltage is applied to the mounting table 61 from a high-frequency power supply part 62. Then, while the interior of the vacuum vessel 5 is evacuated via an exhaust pipe 58, plasma gases, e.g., argon (Ar) gas and oxygen ($O_2$) gas, are introduced into the first vacuum chamber 51 via a plasma gas supply pipe 64 at flow rates of 150 sccm and 120 sccm, respectively, and a thin-film deposition gas, e.g., $SiH_4$ gas, is introduced into the second vacuum vessel 52 via a thin-film deposition gas supply part 64 at a flow rate of 70 sccm, so that the thin-film deposition gas is activated as a plasma by the electron cyclotron resonance to form an $SiO_3$ film 3.

Then, a process for forming a via hole 31 in the $SiO_2$ film 3 is carried out. That is, first, as shown in FIG. 2(b), a resist 71 is applied on the top face of the $SiO_2$ film to expose and develop a predetermined via hole pattern. Subsequently, as shown in FIG. 2(c), in an etching system (not shown), a gas of a compound containing carbon (C) and fluorine (F) (which will be hereinafter referred to as a "CF containing gas"), such as $CF_4$ gas or $C_4F_8$ gas, is used as an etching gas to etch the $SiO_3$ film 3 to form therein a cylindrical via hole 31 having a diameter of, e.g., about 0.5 μm. Thereafter, as shown in FIG. 2(d), $O_2$ gas or hydrogen ($H_2$) gas is used for ashing and removing the resist 71.

Then, a process for forming an adhesion layer on the surface of the SiO$_2$ film 3, in which the via hole 31 has been formed, is carried out (see FIGS. 3(a) and 3(b)). This adhesion layer is provided between the SiO$_2$ layer and a CF film 4, which will be described later, for inhibiting the CF film 4 from being peeled off from the SiO$_2$ film 3. In this example, the adhesion layer is formed by stacking a silicon nitride film (which will be hereinafter referred to as an "SiN film") 81 having a thickness of, e.g., about 100 angstroms, and a silicon carbide (which will be hereinafter referred to as an "SiC film") 82 in that order. The SiN film 81 is a film containing nitrogen (N$_2$) and silicon (Si), and the SiC film 82 is a film containing C and Si. In this example, in the SiN film 81, the ratio of the number of Si atoms to the number of N atoms is preferably 1 or more. Throughout the specification, the SiN film and the SiC film do not mean that the ratio of Si to N and the ratio of Si to C are 1:1.

The SiN film 81 and the SiC film 82 are deposited in, e.g., the plasma treatment system. The SiN film 81 is formed by introducing a plasma gas, e.g., Ar gas, and thin-film deposition gases, e.g., SiH$_4$ gas and N$_2$ gas, at flow rates of 200 sccm, 10 sccm and 6.5 sccm, respectively to activate the thin-film deposition gases as plasmas at a microwave power of 2.4 kW (the high-frequency power supply part 53), at a bias power of 0 kW (the high-frequency power supply part 62) and at a substrate temperature of 350° C. (see FIG. 3(a)). The SiC film 82 is formed by introducing a plasma gas, e.g., Ar gas, and thin-film deposition gases, e.g., SiH$_4$ gas and C$_2$H$_4$ gas, at flow rates of 200 sccm, 10 sccm and 15 sccm, respectively to activate the thin-film deposition gases as plasmas at a microwave power of 2.4 kW, at a bias power of 0 kW and at a substrate temperature of 350° C. (see FIG. 3(b)).

Subsequently, as shown in FIG. 3(c), a process for forming a CF film 4 on the top face of the adhesion layer is carried out. That is, for example, in the above described plasma treatment system, the CF film 4 is formed by using a thin-film deposition material, which is a compound of C and F and which has a bad embedded characteristic, e.g., hexafluorobenzene (C$_6$F$_6$) gas, as a thin-film deposition gas to activate the thin-film deposition gas as a plasma. At this time, thin-film deposition conditions include flow rates of a plasma gas, e.g., Ar gas, and C$_6$F$_6$ gas of 90 sccm and 40 sccm, respectively, a microwave power of 2.4 kW, a bias power of 0 kW and a substrate temperature of 300° C. to 350° C.

Figure 7:
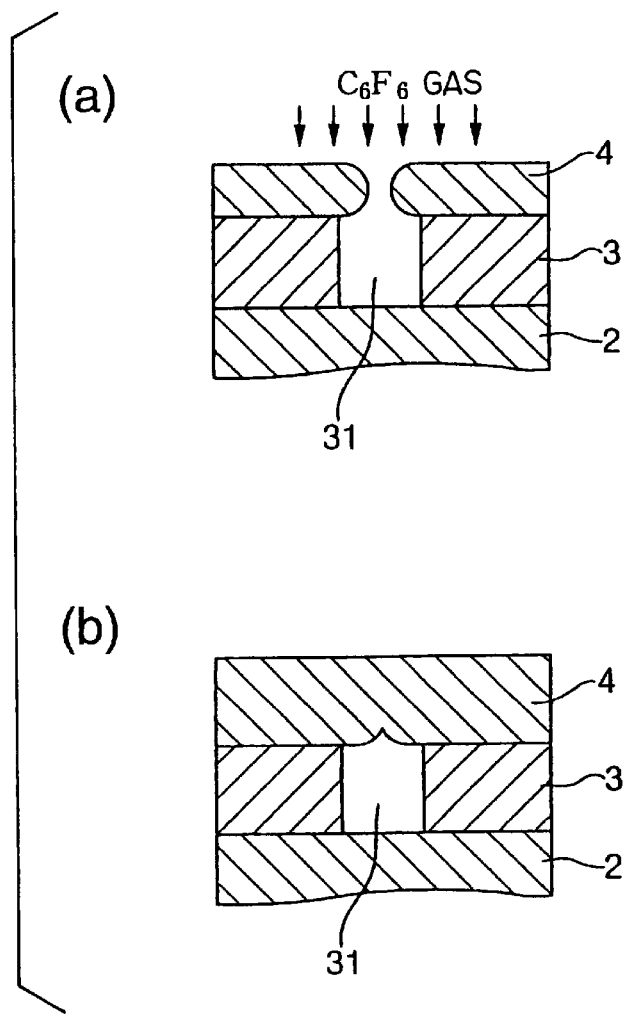
FIG. 7 is a process drawing for explaining the operation of the present invention.

If the CF film is thus deposited using C$_6$F$_6$gas, it is guesses that the CF film is deposited while maintaining a large molecular structure since C$_6$F$_6$ gas is a gas of a compound having a benzene ring (an aromatic compound) which is a large molecule and has strong bonding. Therefore, as shown in FIG. 7(a), the CF film 4 is deposited so as to project inwardly from the periphery of the via hole 31, to gradually reduce the frontage of the via hole 31 to finally close the frontage (see FIG. 7(b)), so that the CF film is not embedded in the via hole 31. Since no bias power is applied at this time, plasma ions are not drawn into the wafer W during the thin-film deposition, and the embedded characteristic of the CF film is further deteriorated, so that the CF film 4 having a thickness of, e.g., 7000 angstroms, is formed on the top face of the adhesion layer while thus inhibiting the CF film 4 from being embedded into the via hole 31. Furthermore, the deposition of the adhesion layer is also inhibited from being deposited into the via hole 31 since no bias power is applied and the thickness of the adhesion layer is 200 angstroms in total which is very small.

Then, as shown in FIG. 3(d), a process for forming a hard mask 83 of, e.g., an SiC film, on the top face of the CF film 4 is carried out. This hard mask 83 is used as a mask in place of a resist during etching of the CF film since the resist is usually made of an organic substance to be ashed with O$_2$ gas or H$_2$ gas which are used as an etching gas during etching of the CF film. The hard mask 83 is provided between the CF film and the resist, and formed of an inorganic film which is not ashed with O$_2$ gas and H$_2$ gas, e.g., an SiN film or an SiC film.

The hard mask 83 is formed in, e.g., the above described plasma treatment system, by introducing a plasma gas, e.g., Ar gas, and thin-film deposition gases, e.g., SiH$_4$ gas and C$_2$H$_4$ gas, at flow rates of 200 sccm, 10 sccm and 15 sccm, respectively to activate the thin-film deposition gases as plasmas at a microwave power of 2.4 kW, at a bias power of 0 kW and at a substrate temperature of 350° C.

Subsequently, a process for forming a groove 41 in the CF film 4 is carried out. That is, as shown in FIG. 4(a), a resist 72 is applied on the top face of the CF film 4 to expose and develop a predetermined groove pattern, and thereafter, as shown in FIG. 4(b), a CF containing gas, e.g., CF$_4$ gas or C$_4$F$_8$ gas, is used as an etching gas in an etching system (not shown) for etching the hard mask 83 to form a groove 83a therein. Then, as shown in FIG. 4(c), in an etching system (not shown), O$_2$ gas or H$_2$ gas is used as an etching gas, and the hard mask 83 is used as a mask for etching the CF film 4 to form therein a groove 41 (see FIG. 1) which has a width of, e.g., about 1.0 μm and which extends in a direction perpendicular to the plane of the figure so that a part of the groove 41 is connected to the via hole 31. At this time, the resist 72 is ashed and removed with O$_2$ gas.

Thereafter, as shown in FIG. 5, a process for filling the groove 41 and the via hole 31 with a metal, e.g., Cu. That is, for example, as shown in FIG. 5(a), a Cu layer 84 is formed on the surface of the hard mask 83 to fill the groove 41 and the via hole 31 with Cu, and thereafter, as shown in FIG. 5(b), a CMP (polishing) process is carried out by means of a CMP (Chemical Mechanical Polishing) system (not shown) to polish and remove the undesired Cu layer 84 to produce a semiconductor device wherein the groove 41 and the via hole 31 are filled with Cu.

In this method, as described above, the deposition of the SiN film 81 and the SiC film 82 into the via hole 31 is inhibited. Even if the SiN film 81 or the like is slightly deposited on the bottom portion of the via hole 31, the amount of the deposition is very small, so that it is etched with F produced from the CF film 4 during etching for the groove 41. Alternatively, the via hole 31 may be cleaned in a separate process to remove the deposited SiN film 81 or the like. In this case, a CF containing gas, such as C$_4$F$_8$ gas or CF$_4$ gas, is used as a cleaning gas.

The method according to the present invention has been made by noticing a thin-film deposition material having a bad embedded characteristic, such as C$_6$F$_6$ gas. In the method according to the present invention, the SiO$_2$ film 3 is previously etched to form the via hole 31, and then, C$_6$F$_6$ is used as a thin-film deposition gas for depositing the CF film 4, so that it is possible to deposit the CF film 4 without embedding the CF film into the via hole 31 as described above. Therefore, if the CF film 4 is subsequently etched to form the groove 41 of a predetermined pattern, it is possible to easily obtain a dual damascene shape.

Thus, in the method according to the present invention, the number of etching steps and the number of metal film forming steps are small, so that the number of steps is small. In addition, the SiO$_2$ film 3 and the CF film 4 are separately etched, and conventional methods can be used therefor, so that it is possible to carry out a stable operation. Therefore, since a semiconductor device having a complicated dual damascene shape can be produced by a simple technique, it is possible to improve throughput, so that it is possible to reduce costs.

In the above described example, the top dielectric film, in which the groove 41 serving as a wiring is formed, is the CF film 4, and the dielectric film, in which the via hole 31 is formed, is the $SiO_2$ film 3. However, since a semiconductor device can be reduced if an dielectric film between wiring parts has a low dielectric constant, such a construction is effective.

Figure 8:
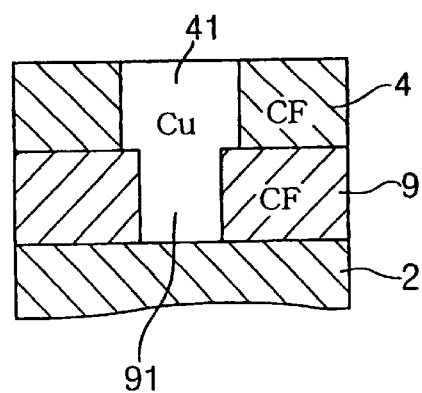
FIG. 8 is a sectional view showing another example of a semiconductor device produced by a method according to the present invention.

In addition, as shown in FIG. 8, the present invention may be applied to the production of a semiconductor device wherein the top dielectric film, in which the groove 41 is formed, is not only the CF film, but the dielectric film, in which a via hole 91 is formed, is also a CF film. In this case, since the CF film having a low dielectric constant is used as the dielectric film, the dielectric constant of the whole semiconductor device can be further reduced. In addition, since the same kind of dielectric films are stacked in such a semiconductor device, adhesion therebetween is large, so that it is not required to provide any adhesion layers for inhibiting both films from being peeled off from each other.

According to the present invention, the top dielectric film, in which the groove is formed, should not be limited to the CF film, it may be any one of dielectric films having a bad embedded characteristic wherein any via holes are not filled.

Such dielectric films may include coating films having low dielectric constants, such as organic SOG (Spin on Glass) films, HSQ (Hydrogen Silsesquioxane) films, BCB (Bisbenzocyclobutene) films, polyimide films, F containing polyimide films, polyallyl ether fluoride films, Teflon films and cytop films.

The dielectric film having the bad embedded characteristic may be formed by setting conditions, on which the dielectric film is formed, to be thin-film deposition conditions, on which embedded characteristics deteriorate. For example, in the case of a usually used plasma TEOS (tetraethoxysilane: $Si(C_2H_5O)_4$), in the parallel plate plasma CVD method, the flow rate of TEDS is 100 sccm, the flow rate of $O_2$ is 100 sccm, the substrate temperature is 330° C., the distance between electrodes is 10 mm and the thin-film deposition pressure is 9 Torr or lower, so that the embedded characteristics can be extremely deteriorated. In addition, as another method for deteriorating the embedded characteristics, in the case of an $SiO_3$ film of plasma $SiH_4$, when a high-density plasma CVD system, such as an ECR or ICP plasma CVD system, is used, e.g., when an ECR plasma CDD system (FIG. 6) is used herein, if flow rates of $SiH_4$, $C_2$ and Ar are 100 sccn, 500 sccm and 150 sccm, respectively, if the substrate temperature is 380° C. and if the thin-film deposition pressure is 5 Torr or higher, the embedded characteristics can be extremely deteriorated.

As a further method for deteriorating the embedded characteristics, in the case of an SiOF film of plasma $SiH_4$, when a high-density plasma CVD system, such as an ECR or ICP plasma CVD system, is used, e.g., when an ECR plasma CVD system (FIG. 6) is used herein, if flow rates of $SiH_4$, $O_2$ and Ar are 100 sccm, 500 sccm and 150 sccm, respectively, if the substrate temperature is 380° C. and if the thin-film deposition pressure is 7 mTorr or higher, the embedded characteristics can be extremely deteriorated.

Thus, even if the prior art and conventional materials are used, if thin-film deposition conditions capable of deteriorating the embedded characteristics are used, an dielectric film having embedded characteristics, which is formed using the thin-film deposition conditions, may be used.

In addition, dielectric films using parylene or methylsilane, e.g., Flowfill (produced by Trikon Technologies Ltd.), may be used. The details of the dielectric films using methylsilane are described in "1998 DUMIC Conference, P311", and the details of the dielectric films using parylene are described in "SEMICONDUCTOR INTERNATIONAL June 96, P211".

FIG. 19 shows the structural formulae of organic SOG, polyimide, F containing polyimide, BCB, polyallyl ether fluoride, parylene-F, Teflon and cytop.

The coating film is formed by supplying a polymeric material, such as the above described organic SOG film, on the surface of the wafer while rotating the wafer, diffusing and applying the polymeric material on the whole surface of the wafer by utilizing the centrifugal force of rotation, and then, hardening the polymeric material by heat. In this case, if a solvent having a high surface tension is used or if adjustments, such as the increase of the number of revolution, are carried out, the coating film can be formed without being embedded into the via hole.

Referring to FIG. 9, as an example of a case where a coating film is used as a top dielectric film, a semiconductor device wherein an dielectric film (which will be hereinafter referred to as a "bottom dielectric film"), in which a via hole is formed, is an $SiO_2$ film 3, and a top dielectric film, in which a groove is formed, is an SiLK film (trademark of Daw Chemical, Co., Ltd.) 100, will be described in detail below.

FIG. 9(*a*) shows a state that the $SiO_2$ film 3 is deposited on a substrate 2 and that a via hole 31 is formed in the $SiO_2$ film 3. The $SiO_2$ film 3 and the via hole 31 are formed by the same method as that in the above described preferred embodiment. Then, as shown in FIG. 9(*b*), a step of forming the SiLK film 100 on the surface of the $SiO_2$ film 3 is carried out. As this example, if the $SiO_2$ film 3 is used as the bottom dielectric film and if the SiLK film 100 is used as the top dielectric film, it is not required to provide any adhesion layers between the $SiO_2$ film and the SiLK film since there is good adhesion between the $SiO_2$ film and the SiLK film.

Figure 10:
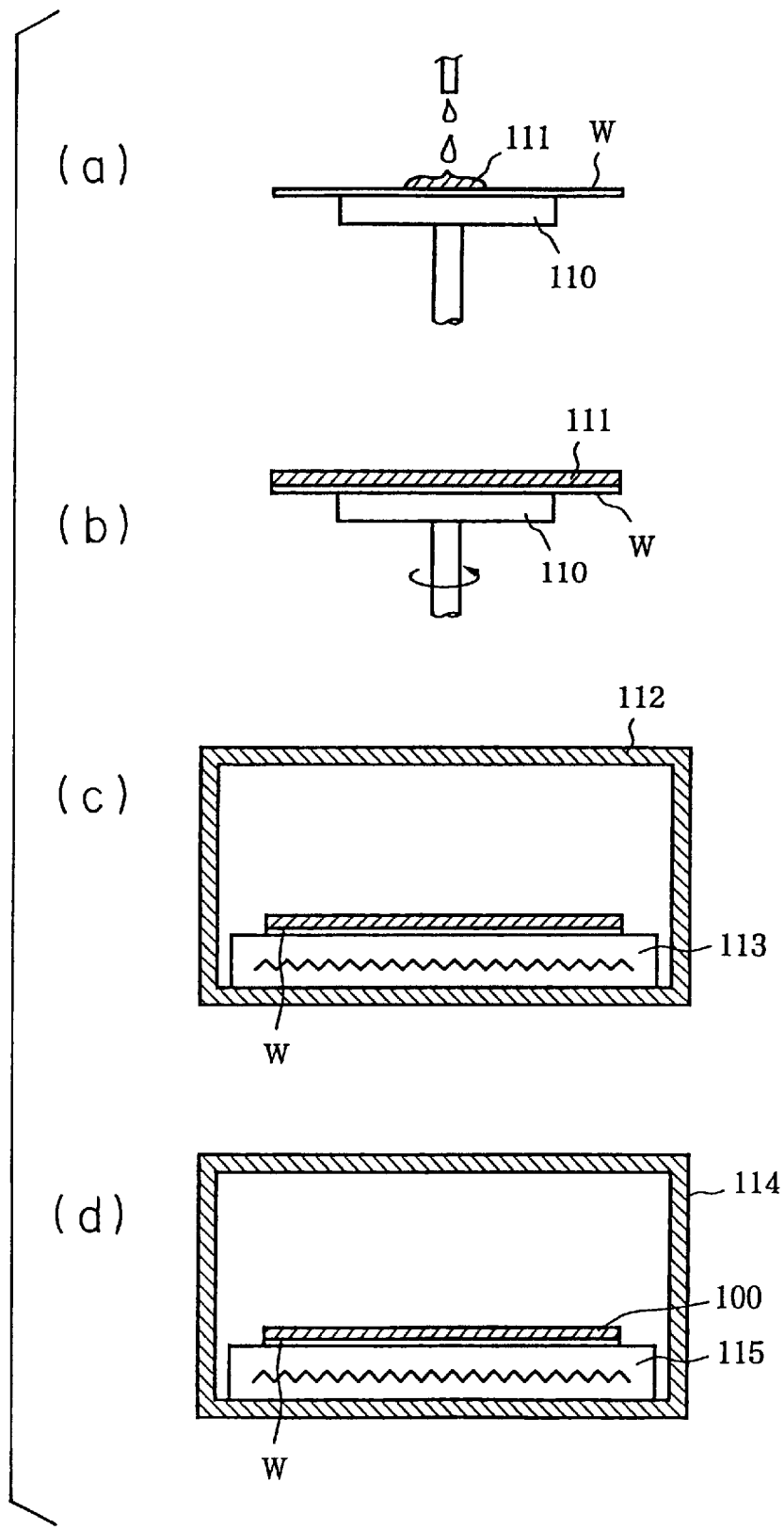
FIG. 10 is a process drawing for explaining a method for forming a coating film.

Referring to FIG. 10, the deposition of the SiLK film will be described. First, for example, as shown in FIG. 10(*a*), while a wafer W is held on a holding member 110 which is rotatable in horizontal directions, a coating material 111 containing a thin-film deposition material for the SiLK film and a solvent for the thin-film deposition material is supplied to the surface of the wafer W. Then, as shown in FIG. 10(*b*), the wafer W is rotated in a horizontal direction to diffuse the coating material 111 over the whole surface of the wafer W by the centrifugal force of rotation. Subsequently, the wafer W is transferred to a baking system, which has a heating plate 113 in a process container 112, to be mounted on the heating plate 113. Then, a baking process is carried out at a temperature of, e.g., 140° C., for a predetermined period of time to vaporize and remove the solvent. Thereafter, the wafer W is transferred to a heating system, which has a heating plate 115 in the process container 114, to be mounted on the heating plate 115. Then, a curing process is carried out at a temperature of, e.g., 400° C., for a predetermined period of time to cause a polymerization reaction to solidify the coating material. Thus, the SiLK film 100 is deposited. In this case, the curing process may be carried out in a heat treating furnace.

Then, as shown in FIG. 9(*c*), after a process for forming a hard mask 101 of, e.g., an $SiO_2$ film, on the top face of the SiLK film 100, a process for forming a groove in the SiLK film 100 by the same method as that in the above described preferred embodiment. That is, after a resist is applied on the top face of the SiLK film 100 to expose and develop a predetermined groove pattern, $O_2$ gas or $H_2$ gas is used as an etching gas for etching the SiLK film 100 to form a groove therein. Then, a process for filling the groove and the via hole 31 with a metal, e.g., Cu, and the CMP process are carried out to produce a semiconductor device.

Figure 11:
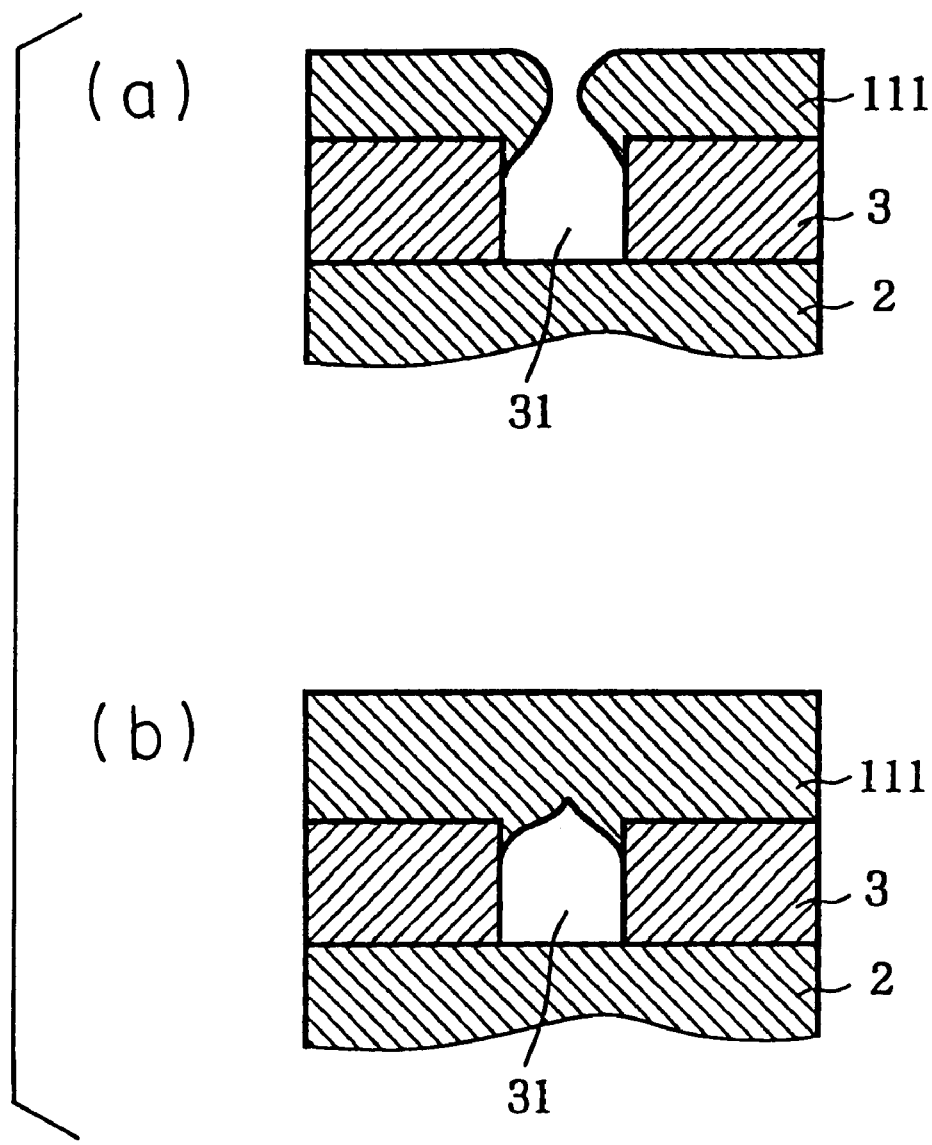
FIG. 11 is an illustration for explaining the operation of another example of the present invention.

The SiLK film 100 is thus formed by applying the coating material 111 on the wafer W. By selecting coating conditions, such as the increase of the surface tension of the solvent and the rotation of the wafer W at a high speed, the coating material 111 can be diffused so as to close the frontage of the via hole 31 as shown in, e.g., FIG. 11(a), and the SiLK film 100 can be applied while the coating material 111 is hardly filled in the via hole 31 (FIG. 11(b)). Thus, when the amount of the SiLK film 100 adhering to the inner surface of the via hole 31 is very small, the SiLK film in the via hole 31 can be removed at the step of etching the SiLK film 100.

When the SiLK film is used as the coating film as this example, the hard mask may be any one of SiOF films, SiN films, TiN films, HSQ films, MSQ films, organic SOG films and coating films of porous silica, in addition to $SiO_2$ films, as shown in a list of FIG. 12. In addition, the bottom dielectric film may be any one of dielectric films containing Si, such as SiOF films and SiN films, HSQ films, MSQ films, organic SOG films and coating films of porous silica, in addition to $SiO_2$ films.

In addition, the coating films used as the top dielectric film may be any one of BCB films (trademark of Daw Chemical Co., Ltd.), organic SOG films, HSQ films and MSQ films (trademark of Daw Chemical Co., Ltd.), FLARE films (trademark of Allied Signal Co., Ltd.) and porous silica, as described above, in addition to the above described SiLK film. Among these films, BCB films, organic SOG films, HSQ films, MSQ films and FLARE films are deposited by carrying out baking and curing processes after spin-coating with a coating material, similar to the SiLK film. In addition, porous silica is deposited by spin-coating with a coating material, gelling the coating material by an aging process, and then, removing the solvent.

The hard masks, etching gases and bottom dielectric films of these films are shown in FIG. 12. That is, the hard masks include $SiO_2$ films, SiOF films, SiN films, TiN films, HSQ films, MSQ films, organic SOG films and porous silica in the case of BCB films and FLARE films, and photoresists in the case of HSQ films and MSQ films. In addition, in the case of organic SOG films and porous silica, a photoresist is formed on the top face of the $SiO_2$ film since these films react with the photoresist.

The etching gas is $O_2$ gas or $H_2$ gas in the case of BCB films and FLARE films, and a CF containing gas in the case of organic SOG films, HSQ films, MSQ films and porous silica. Moreover, the bottom dielectric films include dielectric films containing Si, such as $SiO_2$ films, SiOF films and SiN films, HSQ films, MSQ films, organic SOG films and porous silica in the case of BCB films and FLARE films, and SiLK films, BCB films, FLARE films, CF films, $SiO_2$ films and SiN films in the case of organic SOG films, HSQ films, MSQ films and porous silica. In addition, when the coating film is used as the top dielectric film, an adhesion layer may be provided between the bottom dielectric film and the top dielectric film when adhesion between the bottom dielectric film and the top dielectric film is small.

A semiconductor device comprising a bottom dielectric film of an $SiO_2$ film having a thickness of 5000 angstroms, a top dielectric film of an SiLK film having a thickness of 5000 angstroms, a via hole having a diameter of 0.5 $\mu$m and a groove having a width of 0.4 $\mu$m was produced by the above described process, and the cross sections of the via hole and groove were observed by a SEM (scanning electron microscope). As a result, it was confirmed that the SiLK film was not embedded into the via hole so that a dual damascene shape was formed. In addition, the top dielectric film was changed to each of a BCB film, an FLARE film, an organic SOG film, an HSQ film, an MSQ film and porous silica to produce semiconductor devices in the same manner. As a result, it was confirmed that a dual damascene shape was formed.

Thus, when the coating film is also used as the top dielectric film, it is possible to simply produce a semiconductor device having a complicated dual damascene shape according to the method of the present invention.

Another preferred embodiment of the present invention will be described below.

This preferred embodiment was made by finding that if bottom and top dielectric films are different kinds of dielectric films and have different etch selectivities, even if the top dielectric film is deposited on a part or all of a via hole when the top dielectric film is formed, if an etching time is increased to some extent when the top dielectric film is etched, the top dielectric film in, the via hole can also be removed.

Referring to FIG. 13, as an example of this preferred embodiment, a semiconductor device having a bottom dielectric film of an $SiO_2$ film 3 and a top dielectric film of a CF film 4 will be described in detail. FIG. 13(a) shows a state that after an $SiO_2$ film 3 is deposited on a substrate 2 to form a via hole 31 in the $SiO_2$ film 3 by the same manner as that in the above described preferred embodiment, an SiN film 81 and SiC film 82 serving as an adhesion layer are formed on the top face of the $SiO_2$ film 3.

Then, a CF film 4 is deposited on the top face of the adhesion layer. This CF film 4 is formed in, e.g., the above described plasma treatment system, by using a plasma gas, e.g., Ar gas, and thin-film deposition gases, e.g., $C_4F_8$ gas and $C_2H_4$ gas, and activating the thin-film deposition gases as plasmas. At this time, thin-film deposition conditions include flow rates of Ar gas, $C_4F_8$ gas and $C_2H_4$ gas which are 150 sccm, 40 sccm and 30 sccm, respectively, a microwave power of 2.7 kW, a bias power of 0 kw and a substrate temperature of 300° C. 350° C.

If the CF film is thus deposited, $C_4F_8$ gas is more easily deposited in the via hole 31 than $C_6F_6$ gas since $C_4F_8$ gas is a smaller molecule than $C_6F_6$ gas. For example, $C_4F_8$ gas is deposited on a part of the bottom or side wall of the via hole 31, so that the CF film 4 is deposited on a part of the via hole 31.

Then, as shown in FIG. 13(b), similar to the above described preferred embodiment, a hard mask 83 of, e.g., an SiC film, is formed on the top face of the CF film 4, and a resist 72 is applied, exposed and developed. Thereafter, as shown in FIG. 13(c), a CF containing gas is used as an etching gas for etching the hard mask 83, and subsequently, as shown in FIG. 13(d), the CF film 4 is etched. This etching of the CF film 4 is carried out in an etching system (not shown) using $O_2$ gas or $H_2$ gas as an etching gas and using the hard mask 83 as a mask. In this case, etching time is set to be longer than the time required to etch the CF film 4, by a predetermined period of time. The time required to etch the CF film 4 is determined by confirming the end point of etching by, e.g., the emission analysis of F or CF.

If etching thus continues to be carried out for the predetermined period of time after the etching of the CF film 4 is completed, the CF film 4 existing in the via hole 31 is also etched and removed by a so-called over etching. At this time, since the $SiO_2$ film 3 and CF film 4, in which the via hole 3 is formed, have different etch selectivities, the side wall of the via hole 31 is etched by the over etching without etching the $SiO_2$ film 3 with $O_2$ gas or $H_2$ gas, so that the shape of the via hole is not changed. Therefore, by adjusting the etching time for the CF film 4, it is possible to adjust the removed amount of the CF film adhering in the via hole 31. For that reason, even if the CF film is deposited on a part or all of the interior of the via hole 31 during the deposition of the CF film 4, it is possible to form a dual damascene shape.

In addition, this preferred embodiment can also be applied to a case where the top dielectric film is, e.g., a coating film, such as an SiLK film, a BCB film, an FLARE film, an organic SOG film, an HSQ film, an MSQ film or porous silica, or a parylene or methylsilane film, and the bottom dielectric film has an etch selectivity which is different from that of the top dielectric film.

A semiconductor device comprising an dielectric film of an $SiO_2$ film having a thickness of 5000 angstroms, a top dielectric film of a CF film having a thickness of 5000 angstroms, a via hole having a diameter of 0.5 $\mu$m and a groove having a width of 0.4 $\mu$m was produced by the above described process by setting an etching time for the CF film to be 1.3 times as long as a usual etching time, and the cross section of the via hole before etching and the cross sections of the via hole and groove after etching were observed by a SEM (scanning electron microscope). As a result, it was confirmed that although the CF film was deposited on the bottom and side wall of the via hole before etching, the embedding of the CF film into the via hole and the deformation of the via hole did not appear after etching, so that a dual damascene shape was formed.

In addition, the top dielectric film was changed to each of an SiLK film, a BCB film, an FLARE film, an organic SOG film, an HSQ film, an MSQ film and porous silica to produce semiconductor devices in the same manner. As a result, since the SiLK film and so forth have an etch selectivity which is different from that of the $SiO_2$ film although the embedded amount of the top dielectric film into the via hole is changed by changing the kind of the solvent and the number of revolution of the wafer W, it was confirmed that even if the top dielectric film was deposited on most of the via hole, if the etching time for the top dielectric film was increased, it was possible to remove the top dielectric film in the via hole while inhibiting the shape of the via hole from being changed, so that it was possible to form a dual damascene shape.

A further preferred embodiment of the present invention will be described below.

This preferred embodiment was made by finding that even if bottom and top dielectric films substantially have the same etch selectivity, if a thin film having an etch selectivity which is different from those of these dielectric films is provided between the bottom and top dielectric films, even if the top dielectric film is deposited on a part or all of a via hole, if an etching time is increased to some extent when the top dielectric film is etched, the top dielectric film in the via hole can also be removed without changing the shape of the via hole.

Figure 14:
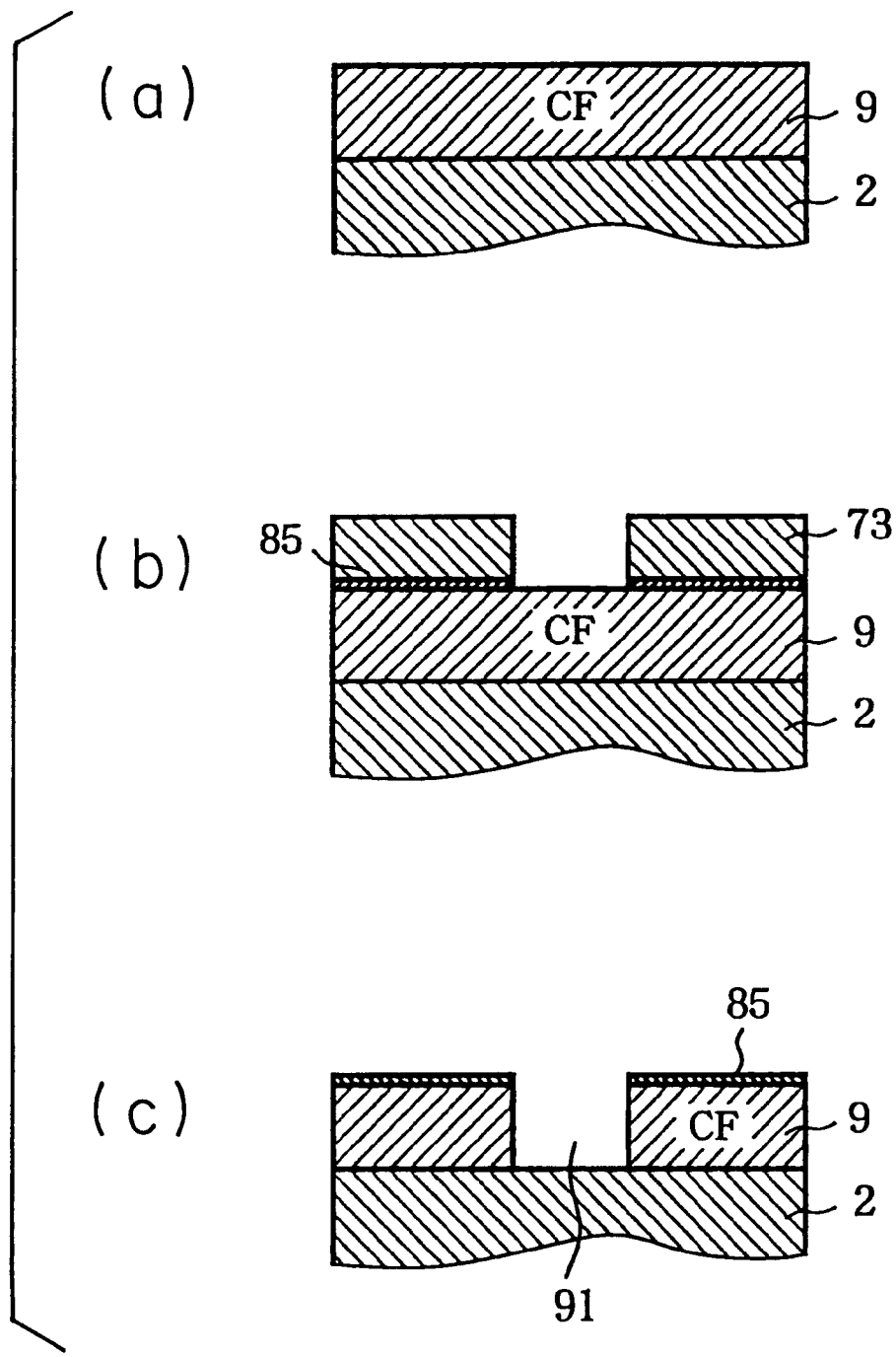
FIG. 14 is a process drawing showing another example of a method according to the present invention.
Figure 17:
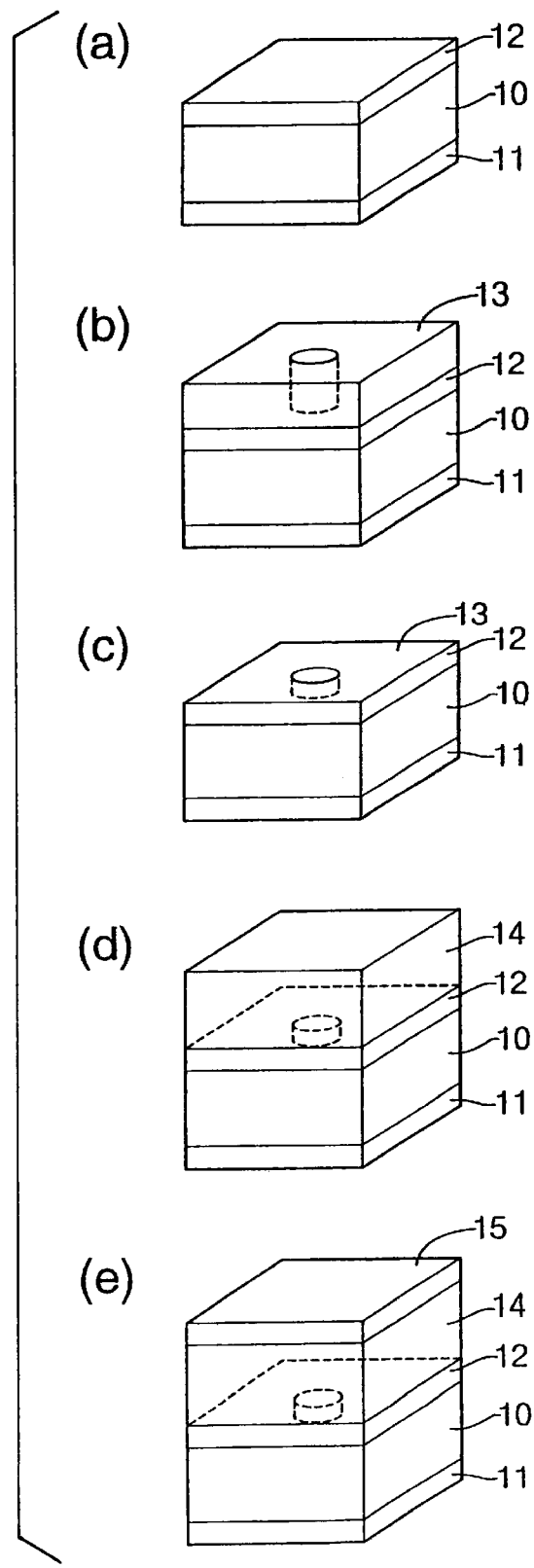
FIG. 17 is a process drawing showing an example of a conventional dual damascene method.
Figure 18:
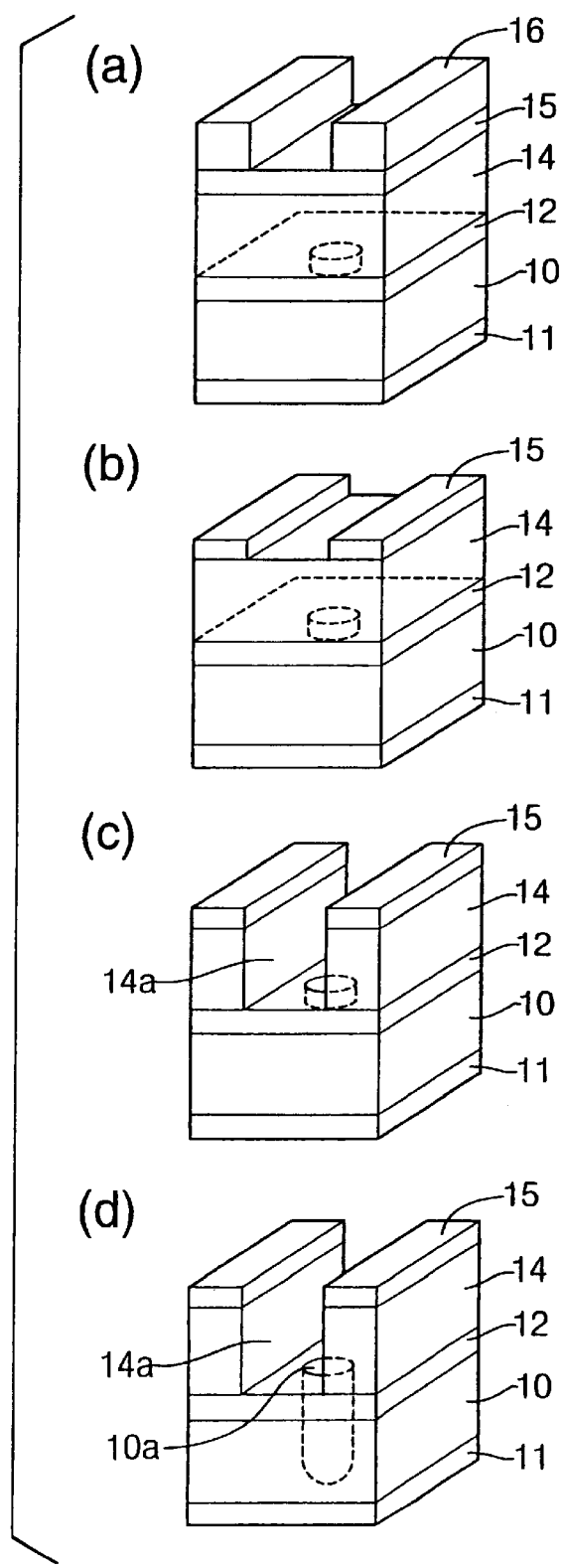
FIG. 18 is a process drawing showing an example of a conventional dual damascene method.

Referring to FIGS. 14 and 15, as an example of this preferred embodiment, a semiconductor device having a bottom dielectric film of a CF film 9 and a top dielectric film of a CF film 4 will be described in detail. FIG. 14(a) shows a state that a CF film 9 is deposited on a substrate 2 by the same manner as that in the above described preferred embodiment. This CF film 9 is formed in, e.g., the above described plasma treatment system, by activating thin-film deposition gases, e.g., $C_4F_8$ gas and $C_2H_4$ gas, as plasmas.

Then, as shown in FIG. 14(b), a hard mask 85 of, e.g., an SiC film, is formed on the top face of the CF film 9, and a resist 73 is applied, exposed and developed. The hard mask 85 is formed in, e.g., the above described plasma treatment system, by activating thin-film deposition gases, e.g., $SiH_4$ gas and $C_2H_4$ gas, as plasmas. Thereafter, as shown in FIG. 14(c), a CF containing gas is used as an etching gas for etching the hard mask 85, and subsequently, $O_2$ gas or $H_2$ gas is used as an etching gas for etching the CF film 9 to form a via hole 91.

Then, as shown in FIG. 15(a), the CF film 4 is deposited on the top face of the hard mask 85. Similar to the above described preferred embodiment, the CF film 4 is formed in, e.g., the above described plasma treatment system, by introducing a plasma gas, e.g., Ar gas, and thin-film deposition gases, e.g., $C_4F_8$ gas and $C_2H_4$ gas, at flow rates of 150 sccm, 40 sccm and 30 sccm, respectively, and activating the thin-film deposition gases as plasmas at a microwave power of 2.7 kW, at a bias power of 0 kW and at a substrate temperature of 300° C. to 350° C. By this thin-film deposition, the CF film 4 is deposited on, e.g., a part of the bottom and side wall of the via hole 91 as described above.

Then, as shown in FIG. 15(b), similar to the above described preferred embodiment, a hard mask 83 of, e.g., an SiC film, is formed on the top face of the CF film 4, and a resist 72 is applied, exposed and developed. Thereafter, a CF containing gas is used for etching the hard mask 83, and $O_2$ gas or $H_2$ gas is used for etching the CF film 4 to form a groove 4 (see FIG. 15(c)). At this time, the etching time for the CF film 4 is set to be longer than the time required to etch the CF film 4, by a predetermined period of time.

If such an over etching is carried out, the CF film existing in the via hole 91 is also etched and removed. At this time, both of the bottom and top dielectric films are formed of the CF film, so that the etch selectivities of both films are the same. However, the hard mask 85 of the SiC film is provided between both films, and the hard mask 85 has an etch selectivity which is different from that of the CF film, so as to prevent the CF film 9 below the hard mask 85 from being etched. In addition, since the CF film 4 is vertically etched, only the etching of the CF film in the via hole 91 proceeds, so that the side wall of the via hole 91 is not scraped. Moreover, the bottom of the via hole 91 is the substrate 2 which has an etch selectivity which is different from that of the CF film, the bottom of the via hole 91 is not scraped.

Therefore, only the CF film 4 existing in the via hole 91 can be removed without changing the shape of the via hole by the over etching, and the removed amount of the CF film adhering in the via hole 91 can be adjusted by adjusting the etching time for the CF film 4. For that reason, when the bottom and top dielectric films are the same kind of dielectric films, even if the top dielectric film is embedded in the via hole during the deposition of the top dielectric film, it is possible to form a dual damascene shape.

In the above described example, since the hard mask of the dielectric film is utilized as the dielectric film which is provided between the bottom and top dielectric films and which has the different etch selectivity from those of the bottom and top dielectric films, there is an advantage in that it is not required to newly form the dielectric film having the different etch selectivity. In this preferred embodiment, the dielectric film having the different etch selectivity may be formed separately from the hard mask.

In addition, as shown in, e.g., FIG. 16(a), a cover film may be formed so as to cover the whole surface of the CF film 9 serving as the bottom dielectric film, i.e., the whole surface of the side wall and bottom of the via hole 91. A cover film 200 is formed of, e.g., an SiN film or SiC film, which have an etch selectivity which is different from that of the CF film serving as the bottom dielectric film. The cover film 200 is formed in, e.g., the above described plasma deposition system, by activating a predetermined thin-film deposition gas as a plasma. At this time, the cover film 200 can be deposited on the side wall and bottom of the via hole 91 by applying a predetermined bias power.

In this case, as subsequently shown in FIGS. 16(b) and 16(c), similar to the above described preferred embodiment, a CF film 4 serving as a top dielectric film is deposited on the surface of the cover film 200, and then, the over etching of the CF film 4 is carried out to remove the CF film 4 which has been deposited in the via hole 91 during the formation of a groove 41 and the deposition of the CF film 4. Thereafter, as shown in FIG. 16(d), an etching gas, e.g., $CF_4$ or $C_4F_8$ gas, is used for removing the cover film 200.

This preferred embodiment can also be applied to a case where the top dielectric film is, e.g., a coating film, such as an SiLK film, a BCB film, an FLARE film, an organic SOG film, an HSQ film, an MSQ film or porous silica, or a parylene or methylsilane film, and the kind of the top dielectric film is different from that of the bottom dielectric film.

A semiconductor device comprising a bottom dielectric film of a CF film having a thickness of 5000 angstroms, a top dielectric film of a CF film having a thickness of 5000 angstroms, a hard mask, which was provided between both dielectric films and which was a bottom dielectric film having a thickness of 500 angstroms, a via hole having a diameter of 0.5 μm and a groove having a width of 0.4 μm was produced by the above described process by setting an etching time for the CF film to be 1.3 times as long as a usual etching time, and the cross section of the via hole before etching and the cross section of the via hole after etching were observed by a SEM. As a result, it was confirmed that although the CF film was deposited on the bottom and side wall of the via hole before etching, the embedding of the CF film into the via hole and the deformation of the via hole did not appear after etching, so that a dual damascene shape was formed.

In addition, the top and bottom dielectric films were changed to SiLK films, BCB films, FLARE films, organic SOG films, HSQ films, MSQ films and porous silica to produce semiconductor devices in the same manner. As a result, although the embedded amount of the top dielectric film into the via hole is changed by changing coating conditions, it was confirmed that even if the top dielectric film was embedded in most of the via hole, if the etching time for the top dielectric film was increased, it was possible to remove the top dielectric film in the via hole while inhibiting the shape of the via hole from being changed, so that it was possible to form a dual damascene shape.

According to the present invention, as the thin-film deposition gas for the CF film having the bad embedded characteristic, $C_4F_8$ gas, $C_5F_8$ gas, $C_6F_{10}$ gas and $C_6H_5CF_3$ gas may be used in addition to $C_6F_6$ gas. In addition, the CF film forming method should not be limited to the method for forming the CF film by producing plasma by the ECR, but it may be formed using a system for producing a plasma called ICP (Inductive Coupled Plasma) or the like by a method for applying electric and magnetic fields to a process gas from a coil wound onto a dome-shaped container.

In addition, the CF film may be formed by a system for producing a plasma called helicon wave plasma by the interaction between a helicon wave of, e.g., 13.56 MHz, and a magnetic field applied by a magnetic coil, a system for producing a plasma called magnetron plasma by applying a magnetic field so that the magnetic field is substantially parallel to two parallel cathodes, or a system for producing a plasma by applying a high-frequency power between electrodes called parallel plates which face each other.

Moreover, the $SiO_2$ film, in which the via hole is formed, is not only formed by the plasma CVD as described above, but it may also be formed by the thermal oxidation method or the sol-gel method. The sol-gel method is a technique for applying a coating solution, which contains colloid of TEOS (tetraethoxysilane: $Si(C_2H_5O)_4$) diffused in an organic solvent, such as ethanol solution, on the surface of a semiconductor wafer W to gel the coating film to dry the coating film to obtain an $SiO_2$ film. In addition, as the adhesion layer formed between the $SiO_2$ film and the CF film, a lamination of an SiN film and an SiC film is effectively used since the SiN film is greatly adhesive to the $SiO_2$ film and since the SiC film is greatly adhesive to the CF film. However, one of these films may be used.

In addition, as the film in which the via hole is formed, a coating film, such as an SiOF film, an organic SOG film, an HSQ film, a BCB film, a polyimide film, an F containing polyimide film, a polyallyl ether fluoride, Teflon or cytop, may be used in addition to the $SiO_2$ film.

Moreover, even if a thin-film deposition material having a bad embedded characteristic is used for forming a top dielectric film, a so-called over etching may be carried out when an etching process for forming a groove in the top dielectric film is carried out.

As described above, according to the present invention, it is possible to produce a semiconductor device by a dual damascene method which is a simple technique.

What is claimed is:

1. A method of manufacturing a semiconductor device, said method comprising the steps of:
   forming a dielectric film on an object to be treated;
   etching said dielectric film to form a via hole therein;
   forming a top dielectric film having an etch selectivity, which is different from that of said dielectric film and which is substantially equal to that of a resist, on a surface of said dielectric film, in which said via hole has been formed, so as to straddle an opening of said via hole;
   forming a resist of a predetermined pattern on said top dielectric film;
   etching said top dielectric film to form therein a groove, in which a metal is embedded for forming a wiring, so that said groove contacts at least a part of said via hole, and simultaneously ashing said resist; and
   continuously etching said top dielectric film for a predetermined period of time after said etching of said top dielectric film is completed, so that said top dielectric film deposited in said via hole is etched to be removed.

2. A method of manufacturing a semiconductor device as set forth in claim 1, wherein said dielectric film is an interlayer dielectric film in a semiconductor device having a multi-layer metallization structure.

3. A method of manufacturing a semiconductor device as set forth in claim 1, wherein said top dielectric film is a fluorine containing carbon film.

4. A method of manufacturing a semiconductor device as set forth in claim 1, wherein said top dielectric film is a coating film.

5. A method of manufacturing a semiconductor device, said method comprising the steps of:

forming a dielectric film on an object to be treated;

etching said dielectric film to form a via hole therein;

forming a thin film having an etch selectivity, which is different from that of said dielectric film, on a surface of said dielectric film in which said via hole has been formed;

forming a top dielectric film having an etch selectivity, which is substantially equal to those of said dielectric film and a resist, on a surface of said thin film;

forming a resist of a predetermined pattern on said top dielectric film;

continuously etching said top dielectric film to form therein a groove, in which a metal is embedded for forming a wiring, so that said groove contacts at least a part of said via hole, and simultaneously ashing said resist; and etching said top dielectric film for a predetermined period of time after said etching of said top dielectric film is completed, so that said top dielectric film deposited in said via hole is etched to be removed.

6. A method of manufacturing a semiconductor device as set forth in claim 5, wherein said top dielectric film is formed so as to straddle an opening of said via hole.

7. A method of manufacturing a semiconductor device as set forth in claim 5, wherein said dielectric film is an interlayer dielectric film in a semiconductor device having a multi-layer metallization structure.

8. A method of manufacturing a semiconductor device as set forth in claim 5, wherein said top dielectric film is a fluorine containing carbon film.

9. A method of manufacturing a semiconductor device as set forth in claim 5, wherein said top dielectric film is a coating film.

* * * * *

UNITED STATES PATENT AND TRADEMARK OFFICE
CERTIFICATE OF CORRECTION

| | | |
|---|---|---|
| PATENT NO. | : 6,737,350 B1 | Page 1 of 1 |
| APPLICATION NO. | : 09/665960 | |
| DATED | : May 18, 2004 | |
| INVENTOR(S) | : Takashi Akahori et al. | |

It is certified that error appears in the above-identified patent and that said Letters Patent is hereby corrected as shown below:

Title page,
Item [*], Notice, "Subject to any disclaimer, the term of this patent is extended or adjusted under 35 U.S.C. 154(b) by 438 days." should read -- Subject to any disclaimer, the term of this patent is extended or adjusted under 35 U.S.C. 154(b) by 228 days --.
Item [57], ABSTRACT,
Line 10, "SiO2" should read -- $SiO_2$ --.

Signed and Sealed this

Twenty-seventh Day of June, 2006

JON W. DUDAS
*Director of the United States Patent and Trademark Office*